US006239038B1

(12) United States Patent
Wen

(10) Patent No.: US 6,239,038 B1
(45) Date of Patent: *May 29, 2001

(54) METHOD FOR CHEMICAL PROCESSING SEMICONDUCTOR WAFERS

(76) Inventor: Ziying Wen, P.O. Box 1285, Gresham, OR (US) 97030

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/711,131

(22) Filed: Sep. 9, 1996

Related U.S. Application Data

(63) Continuation-in-part of application No. 08/543,071, filed on Oct. 13, 1995, now abandoned.

(51) Int. Cl.[7] .................... H01L 21/302; H01L 21/461
(52) U.S. Cl. ................................. 438/745; 156/345
(58) Field of Search .................... 438/692, 691, 438/704, 695, 745; 156/345; 134/1, 31, 29

(56) References Cited

U.S. PATENT DOCUMENTS

| 4,495,024 | 1/1985 | Bok . |
| 4,521,268 | 6/1985 | Bok . |
| 4,575,408 | 3/1986 | Bok . |
| 4,587,002 | 5/1986 | Bok . |
| 4,600,471 | 7/1986 | Bok . |
| 4,663,197 | 5/1987 | Bok . |
| 4,681,776 | 7/1987 | Bok . |
| 4,805,023 | 2/1989 | Younse et al. . |
| 4,857,142 | 8/1989 | Syverson . |
| 4,899,768 | 2/1990 | Yatabe . |
| 4,917,123 | 4/1990 | McConnell et al. . |
| 4,924,890 | 5/1990 | Giles et al. . |
| 4,932,168 | 6/1990 | Tada et al. . |
| 4,935,981 | 6/1990 | Ohtani et al. . |
| 4,941,489 | 7/1990 | Kamimura et al. . |
| 4,952,115 | 8/1990 | Ohkase . |
| 4,962,049 | 10/1990 | Chang et al. . |
| 4,974,619 | 12/1990 | Yu . |
| 4,996,160 | 2/1991 | Hausman Hazlitt et al. . |
| 5,000,795 | 3/1991 | Chung et al. . |

(List continued on next page.)

FOREIGN PATENT DOCUMENTS 360 678   3/1990  (EP) .

OTHER PUBLICATIONS

Bok, Edward, "Supercritical Fluids for Single Wafer Cleaning," *Solid State Technology*, pp. 117–118, 120, (Jun. 1992).

*Primary Examiner*—Benjamin L. Utech
*Assistant Examiner*—Duy-Vu Deo
(74) *Attorney, Agent, or Firm*—Christensen O'Connor Johnson Kindness PLLC

(57) ABSTRACT

A method and apparatus for processing semiconductor wafer blanks comprises an enclosed chamber with upper and lower plates with a plurality of fluid openings leading from a source of chemical cleaning fluids, flushing fluid and dry nitrogen gas. The top plate also acts as a vacuum chuck to hold the wafer after the top surface has been cleaned and may rotate or oscillate to enhance the cleaning of the lower wafer surface. The method includes a chemical cleaning of the wafer top followed by processing the lower surface by pumping appropriate chemicals through the lower plate center toward the wafer periphery while the wafer is extremely close to the surface so that the outward moving fluids cover the wafer surface and are sparingly used. As the chemicals flow toward the periphery, their strength is renewed by the addition of new chemicals pumped through additional holes.

20 Claims, 15 Drawing Sheets

U.S. PATENT DOCUMENTS

| | | |
|---|---|---|
| 5,001,084 | 3/1991 | Kawai et al. . |
| 5,009,240 | 4/1991 | Levi . |
| 5,025,597 | 6/1991 | Tada et al. . |
| 5,035,750 | 7/1991 | Tada et al. . |
| 5,078,801 | 1/1992 | Malik . |
| 5,095,927 | 3/1992 | Thompson et al. . |
| 5,100,839 | 3/1992 | Terao . |
| 5,105,254 | 4/1992 | Terao . |
| 5,129,198 | 7/1992 | Kanno et al. . |
| 5,129,955 | 7/1992 | Tanaka . |
| 5,129,958 | 7/1992 | Nagashima et al. . |
| 5,144,711 | 9/1992 | Gill, Jr. . |
| 5,148,832 | 9/1992 | Bran . |
| 5,158,100 | 10/1992 | Tanaka et al. . |
| 5,159,946 | 11/1992 | Seiichiro . |
| 5,180,431 | 1/1993 | Sugimoto et al. . |
| 5,181,985 | 1/1992 | Lampert et al. . |
| 5,224,503 | 7/1993 | Thompson et al. . |
| 5,230,743 | 7/1993 | Thompson et al. . |
| 5,232,511 | 8/1993 | Bergman . |
| 5,232,563 | 8/1993 | Warfield . |
| 5,234,499 | 8/1993 | Sasaki et al. . |
| 5,240,552 * | 8/1993 | Yu et al. ............................. 438/692 |
| 5,259,407 | 11/1993 | Tuchida et al. . |
| 5,261,965 | 11/1993 | Moslehi . |
| 5,275,690 | 1/1994 | Garwood, Jr. . |
| 5,294,259 * | 3/1994 | Canestaro et al. ................... 118/411 |
| 5,308,791 | 5/1994 | Horiike et al. . |
| 5,320,218 | 6/1994 | Yamashita et al. . |
| 5,330,577 | 7/1994 | Maeda et al. . |
| 5,336,371 | 8/1994 | Chung et al. . |
| 5,338,390 | 8/1994 | Barbee et al. . |
| 5,427,627 | 6/1995 | Canestaro et al. . |
| 5,429,711 * | 7/1995 | Watanabe et al. .................. 438/692 |
| 5,489,341 | 2/1996 | Bergman et al. . |
| 5,494,526 | 2/1996 | Paranjpe . |
| 5,593,537 * | 1/1997 | Cote et al. ........................... 438/692 |

\* cited by examiner

METHOD FOR CHEMICAL PROCESSING SEMICONDUCTOR WAFERS

CROSS REFERENCES TO RELATED APPLICATIONS

This is a continuation-in-part of U.S. patent application Ser. No. 08/543,071, filed Oct. 13, 1995 now abn. This continuation-in-part application includes descriptions of preferred embodiments of the present invention as set forth in the disclosure document number 383,408, filed in the U.S. Patent and Trademark Office on Oct. 14, 1995.

FIELD OF THE INVENTION

This invention relates generally to the surface preparation of objects with fine surfaces such as semiconductor wafers and particularly to a method and apparatus for both wet and dry processing of such wafers.

BACKGROUND OF THE INVENTION

Microelectronics processing is a matter of surfaces. Processing techniques are concerned with modifying properties less than a few microns below or above the surface of a substrate material. Present complex electronic integrated circuits are formed by using planar processes in which an ultraclean, flat wafer of silicon is used as a substrate upon which a large number of identical devices are built by various oxidation, photolithography, removal, ion bombardment and deposition processes. Therefore, the integrated circuit manufacturing is essentially a sequence of chemical processes.

An ultraclean surface preparation before and after the processes necessary for the patterning of microelectronics devices is now more important than ever before as the surface diameter extends toward 300 mm. and the structure dimension shrink below microns. It is well known that the device performance, reliability and product yield of silicon circuits are critically affected by the presence of chemical contaminants and particulate impurities on the wafer of device surface.

Current existing methods for ultraclean surface preparation can be divided into two main categories: wet processes, such as immersion and spray techniques, and dry processes such as chemical vapor and plasma based techniques.

Wet processing consists of a series of steps of immersing or spraying the wafers with appropriate chemical solutions. The wet processes for ultraclean wafer surface preparation has been successfully used for the past twenty-five years and are still the predominant methods used in manufacturing circuits. However, the high cost of the large amount of ultrapure chemicals required in the current wet processes and the treatment of hazardous waste resulting from the processes, together with its incompatibility with the advanced concepts of integrated processing such as cluster tooling, are the main reason for searching for gas processing methods that are less affected by these limitations.

Although dry processing has shown several advantages in the chemical processing of advanced sub-micron features integrated circuits with high aspect ratio structures, numerous advantages of wet chemical processing often outweigh their "generic" problems in many production applications.

There is a real need in today's semiconductor fabrication industry to tailor the chemical processes to minimize the manufacturing costs in order to remain competitive in the ever increasing demands of the semiconductor market, while at the same time, to meet the increasing quality demands of the devices. The best answer for that is to combine the wet and dry techniques into the processes.

Thus, there is a need of a method and apparatus for the ultraclean surface preparation that is capable of performing both wet and dry chemical processes.

There is also a strong need for a method and apparatus to reduce chemical consumption, to reduce processing steps, and to increase equipment utilization without losing the effectiveness of the process.

There is further need for a method and a system that can be fully automated, well controlled, and integrated with cluster tool environments.

SUMMARY OF THE INVENTION

The present invention provides a method and apparatus capable of either liquid or gas processing of semiconductor wafers or other objects having fine surfaces.

The apparatus of the invention includes an enclosed housing of a material unaffected by the chemicals used in the process. The housing has an internal cavity that contains a rotatable and vertically movable upper plate having apertures for either admitting chemical fluids or to apply a vacuum for venting the housing or for grasping a wafer which is positioned between the upper plate and a lower plate having apertures appropriately placed in its surface for admitting processing fluids and drying gas.

The preferred method is to force a thin layer of processing fluid, either gas or liquid, through the narrow space between the surfaces of a semiconductor wafer and plates of the processing apparatus. While the fluid passes through the narrow space, it contacts and interacts both chemically and physically with the semiconductor wafer surfaces. The narrow space may be from 0.01 mm. to 10 mm, depending on the nature of the chemical processes.

In a preferred embodiment, the particular choice of spacing will be one where an optimum fluid flow is created to simultaneously bring fresh chemicals into contact with the surface of the semiconductor wafer and remove unwanted reaction products away from the surface of the semiconductor wafer toward the drain in order to prevent the unwanted reaction products from redepositing on the surface of the semiconductor wafer. In this regard, the chemical flow can be turbulent or laminar, depending on the nature of the process being carried out. In the preferred embodiment, the particular choice of narrow space will additionally result in the desired processing of the semiconductor wafer surface using a minimum of chemicals, as well as minimize the costs of treating the resulting hazardous wastes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

While the processing apparatus may be used for different applications, it probably will have its greatest application in the processing of semiconductor wafers.

Figure 1:
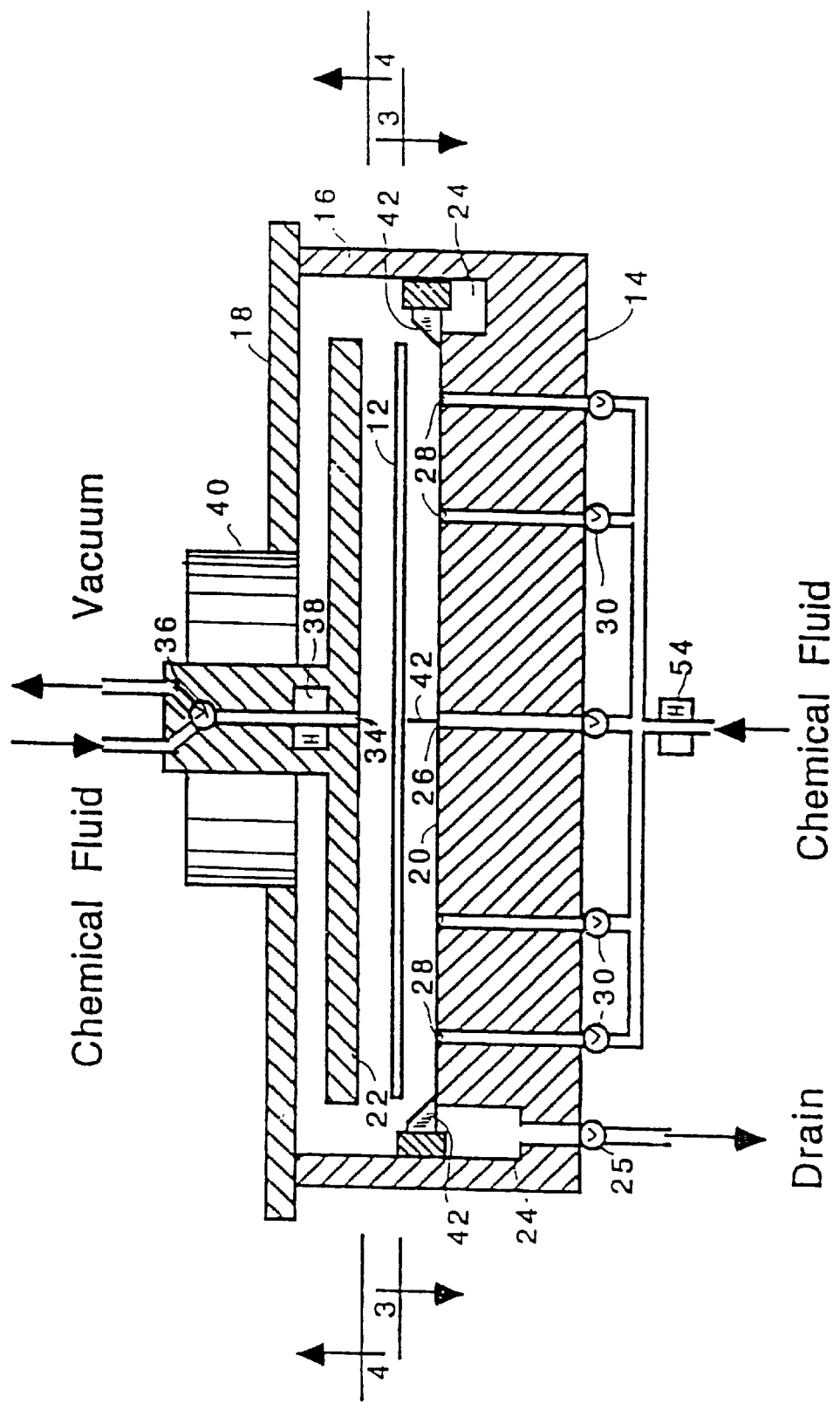
FIG. 1 is a section elevation view of the chemical processor.

In FIG. 1 a semiconductor wafer 12 is shown positioned within a chamber having a base 14, sidewalls 16, and a removable top cover 18. The wafer is located between a lower plate 20 and a rotatable and vertically movable upper plate 22. The wafer is generally a thin silicon circular disc between about four and twelve inches in diameter. In the illustrated processing apparatus the wafer 12 is to be processed on both upper and lower surfaces with the lower surface being more thoroughly treated for construction of integrated circuitry.

The lower plate 20, and preferably the entire structure, is formed of a material unaffected by the various chemical fluids used in the process (e.g., a synthetic resin polymer sold under the trademark TEFLON) and the plate 20 has a flat circular central surface having a diameter equal to or larger than the diameter of the wafer 12 and with a high edge rim or sidewall 16. Between the central surface of plate 20 and rim 16 is a drain slot 24 having a valve 25 at the effluent outlet at its lowest point.

The top surface of the lower plate 20 has two or three circular concentric grooves spaced around a central fluid opening 26 which may be a circular hole or may be a slit. Each of the circular concentric grooves has eight to ten fluid openings 28 which, as with opening 26, extend through the lower plate 20 and base 14 and terminate in a valve 30. The valves are connected through a fluid heater 54 to a common fluid conduit 32 leading from a source of aqueous and gaseous processing chemicals shown in the system diagram of FIG. 2.

Upper plate 22 is formed of the same material as lower plate 40, and is circular with a diameter substantially equal to that of the flat circular surface of the lower plate 20 so that it will fit and rotate within the side walls 16 of the lower plate. Upper plate 22 may have a single central fluid entry opening 34 leading through a valve 36 and heater 38 to the source of processing chemicals, or there may be several entry openings leading to valve 36.

The upper plate 22 also functions as a vacuum chuck for holding the wafer during part of the process or may be used for venting the chamber interior. Therefore the valve 36 is capable of selecting either a flow of fluid into the apparatus or a vacuum applied to the apparatus for securing a wafer disc during a part of the process. Upper plate 22 may also be rotated or oscillated around its axis and is vertically movable by a motor 40 attached to the top cover 18 of the apparatus. The oscillation of the upper plate 22 is for agitation during processing and for the elution of chemicals from a wafer being held by the vacuum chuck.

Although the apparatus described is well suited for production line type of processing a typical single wafer cleaning operation in an initially clean and dry apparatus will now be described.

The top cover 18 with the upper plate 22 is lifted and a wafer 12 is held to its vacuum chuck while the vacuum is applied. In the preferred embodiment, the plate 22 places the adhering wafer 12 on at least three equally spaced, radially adjustable beveled fingers 42 overlying the lower plate surface and in the side wall 16 which can adjust the height of the wafer 12 from about 0.005 mm. to 10 mm. above the lower plate 20. The vacuum is released from the chuck, the upper plate 22 is raised 0.01 to 10 mm. and a flow of cleaning chemicals is applied to the top surface of the wafer 12 through the opening 34 in the upper plate 22.

When the wafer top surface is thus cleaned and dried, valve 36 is closed and a flow of processing chemicals is applied to the bottom surface through the opening 26 and through one or more of the concentric grooves fed by opening 28. An ultraclean wafer surface is obtained in the preferred process by an optimized velocity passage of appropriate chemicals over the wafer surface. To obtain the desired velocity and to achieve the best effectiveness of the dynamic fluids while conserving costly chemicals, the processing fluids are pumped through the openings 26 and 28 as the bottom surface of wafer 12 is positioned very close (e.g. 0.01–1.0 mm.) to the lower plate by forcing down the wafer, as needed, with the upper plate.

A flow of fluid pumped through only the central opening 26 will not assure that the entire lower surface of the wafer will receive adequate fluid, nor fluid received near the periphery of the wafer will have the same processing power as the fresh fluid emanating from the opening. The surface grooves and the plurality of openings in each groove in the lower plate 20 will assure both an adequate supply of fluid to float the wafer off the lower plate and will provide a fresh supply of fluids to all areas of the wafers bottom surface as the fluid rushes toward the periphery. It is noted that in other embodiments of the present invention varying the flow of fluids pumped through openings 26 and 28 to float the wafer to varying heights above the lower plate may be used in place of the radially adjustable beveled fingers 42.

Some processing steps may require a soaking period which is provided by closing the valve 25 from the drain slot 24. In such a case agitation of the wafer may be very important and locking the wafer to the vacuum chuck and engaging the motor 40 for slow rotation or oscillation of the upper plate and wafer will assure that the bottom surface becomes thoroughly processed.

Rinsing of a chemically washed wafer usually requires great quantities of deionized water for elution of all traces of chemical from the wafer and to thoroughly rinse the various crevices and wafer holding clamps of the equipment. It should be noted that the apparatus described has no crevices nor holding clamps in which contaminants or chemical solutions can deposit and hide; both the chemicals and the rinsing water merely flow in over the wafer and flow out through the drain. Hence, a relatively small amount of deionized rinse water is required and all possibility of cross-contamination can be eliminated. After the processing, the chemical supply is shut off and the water supply is passed through the same openings 26, 28 as used for the chemical solutions. This rinsing water passes over the surface of the wafer and through the drain slot 24.

The processed and rinsed wafer is dried by passing a dry inert gas such as nitrogen, through the fluid conduits and the openings 26, 28, 34. Then the vacuum chuck is again actuated to hold the cleaned wafer so that the top cover 18 with the upper plate 22 may be removed. Releasing the vacuum will then release the wafer.

Figure 2:
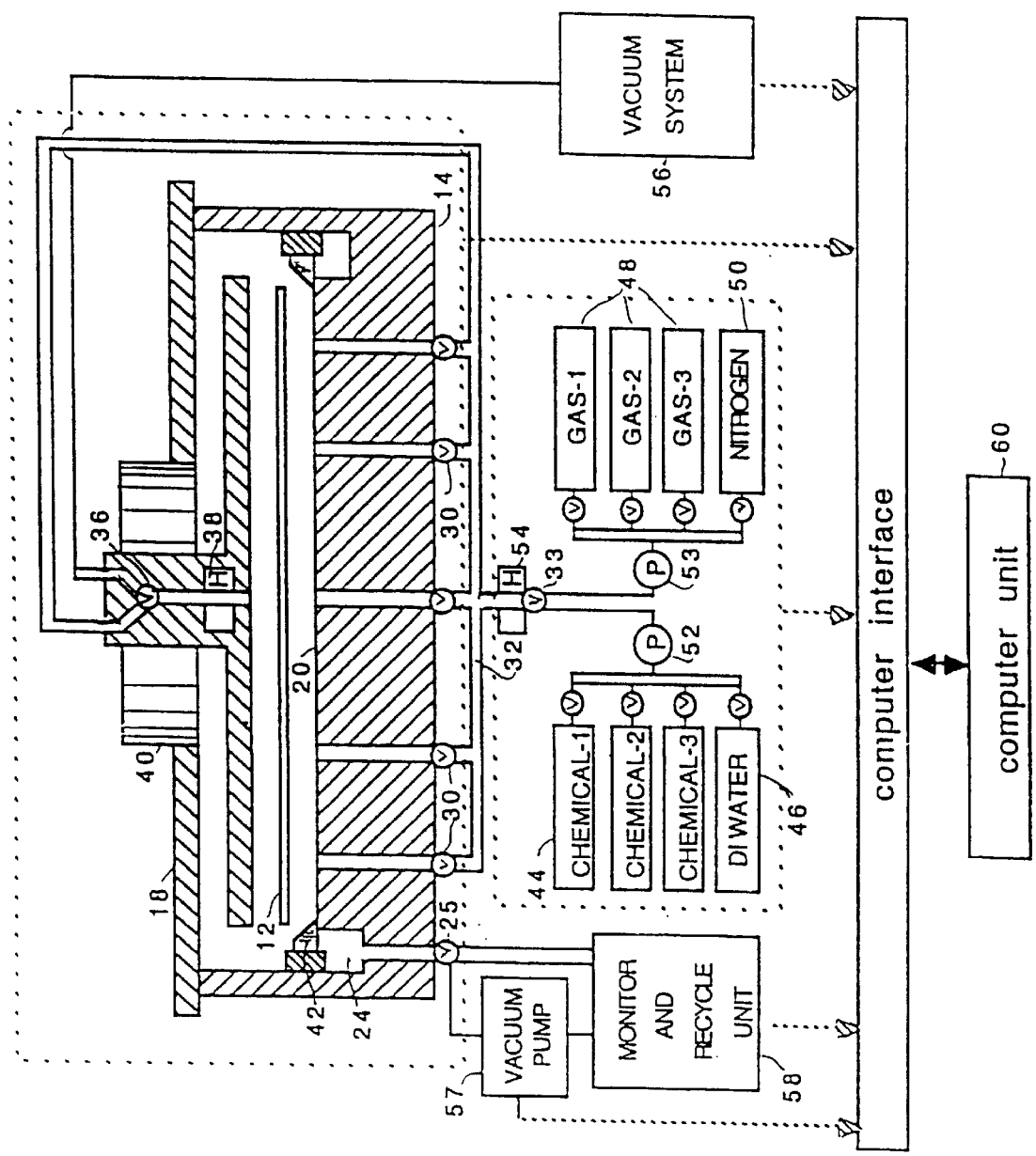
FIG. 2 is an illustration of the chemical processor with the associated equipment and supplies necessary for chemical processing.

FIG. 2 illustrates the processing apparatus of FIG. 1 along with the equipment and supplies to make a computer controlled automated processing unit. Included are fluid supplies including three tanks of chemical liquids 44 and a tank of deionized water 46 and three tanks of dry processing gases 48 and a tank of nitrogen 50. Obviously, other tanks of wet or dry fluids may be added. Each liquid chemical tank has its own valve where the liquid enters a mixing conduit or manifold at the input of a pump 52 followed by a switching valve 33, then a heating element 54. Each dry chemical tank has its own regulator and valve where the fluid is admitted into a mixing conduit or manifold at the input of a pump 53 followed by a switching valve 33 and the heating element 54. The heating element is coupled directly to the mixing input conduit or manifold 32 of FIG. 1, which is shown connected to the selector valve 36 for admitting cleaning fluids to the top surface of the wafer through the top plate 22 in FIG. 2.

A vacuum pump 56 is coupled to the vacuum terminal of the selector valve 36. A second vacuum pump is coupled to the drain valve for the removal of dry chemicals and the effluent of both dry and liquid chemicals is monitored and recycled, as desired, by a monitor and recycle unit 58 coupled to the output of the drain valve 25.

For full computer control, a digital computer 60 may be added to control the operation of the process. Each valve, pump, heater and motor is under the control of the computer which may be programmed according to timed sequences. For example, when a wafer has been installed, the computer may start at time, t1, with a three minute bath of heated deionized water through the top plate 22, followed at time t2 with one minute of a strong cleaning reagent to the top surface, followed at t3 by three minutes of rinsing, then at t4 a vacuum clamps the wafer to the top plate 22 and adjusts the fingers 42 to position the wafer 0.50 mm. above the surface of the lower plate 20. Then follows a complete cleaning of the lower surface of the wafer, until probably at t50, heated nitrogen may be applied for drying. The procedure is variable, depending upon the nature and requirements of the process, the condition of the substrate wafer and the size of the wafer surface. The process steps can be completed sequentially.

Figure 3:
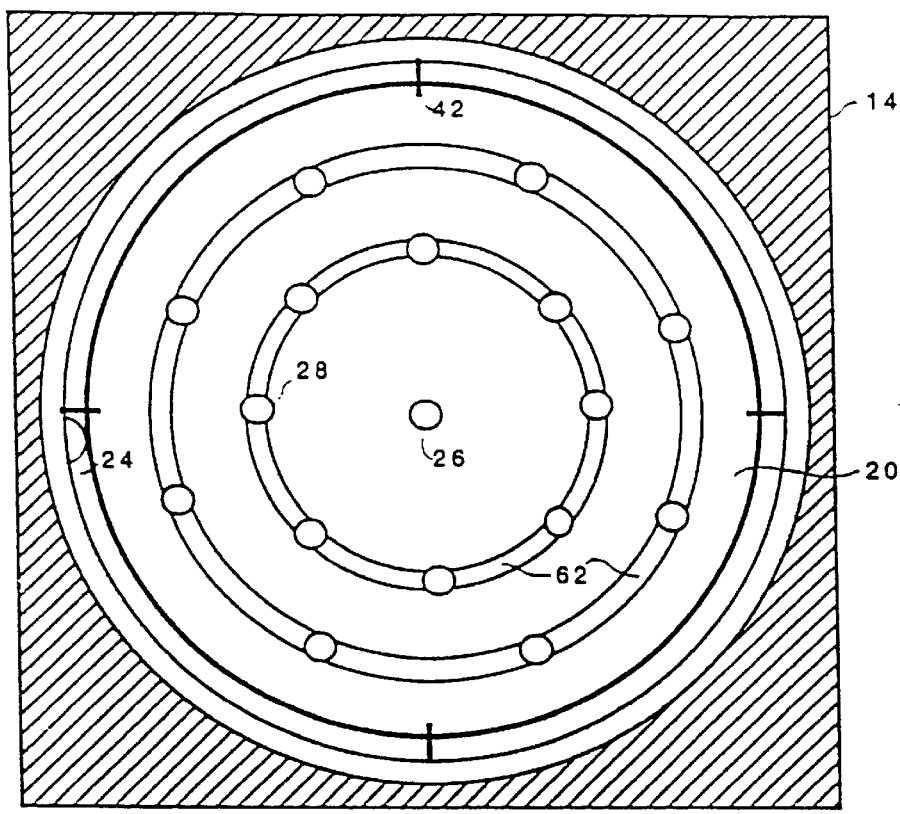
FIG. 3 is a plan view taken along the lines 3—3 of FIG. 1.
Figure 5:
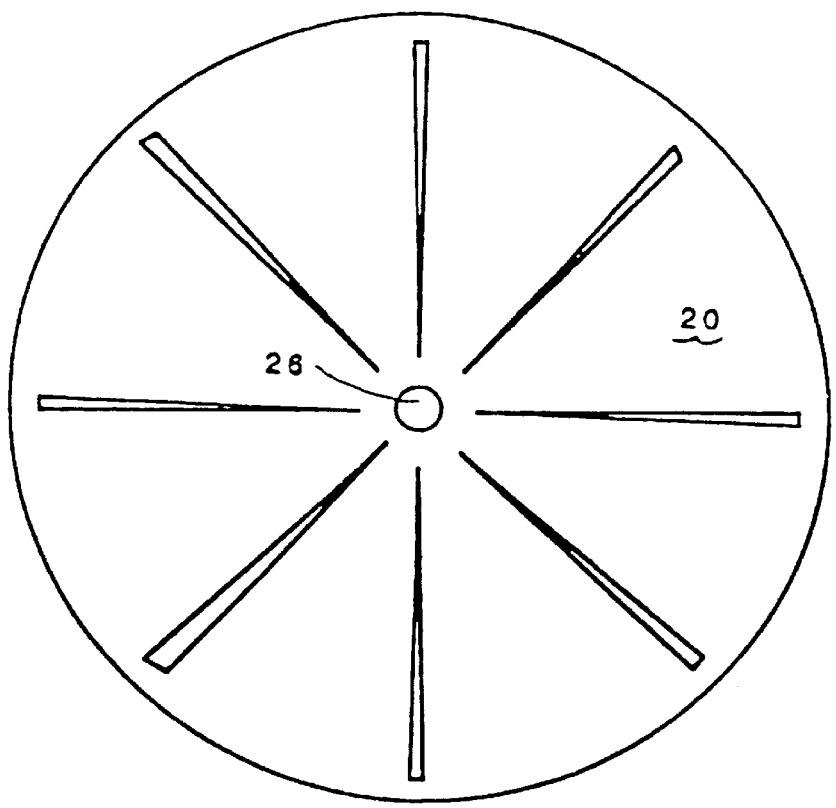
FIGS. 5 and 6 are plan views of alternate embodiments of the plates of FIGS. 3 and 4 showing slots in the plate surface.
Figure 6:
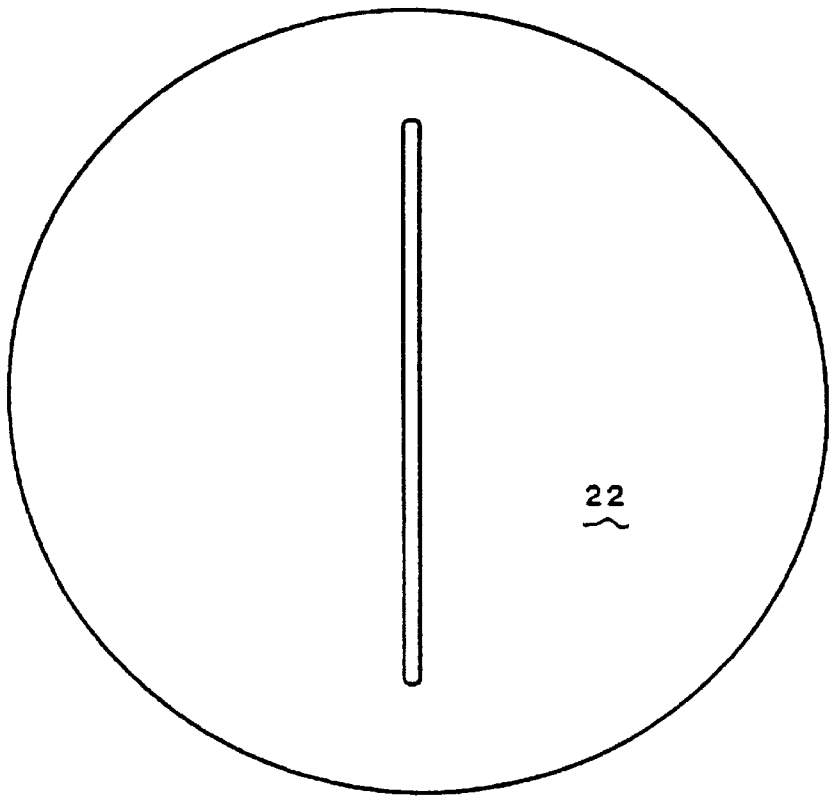

FIG. 3 is a plan view of the lower plate 20 as taken along the lines 3—3 of FIG. 1 and shows the concentric grooves 62 in the plate surface linking the fluid openings 28 for evenly distributing the chemical reactants. If a processing liquid were admitted only through the central opening 26 it would be insufficient to cover the entire wafer surface and if a large quantity of liquid were to enter only through the central opening, the reactant strength would diminish as it flowed outward and covered a greater area. Hence, the grooves and the additional openings 28, as shown in FIGS. 5 and 6, will provide additional, original strength fluid to the uniformity of the process.

Figure 4:
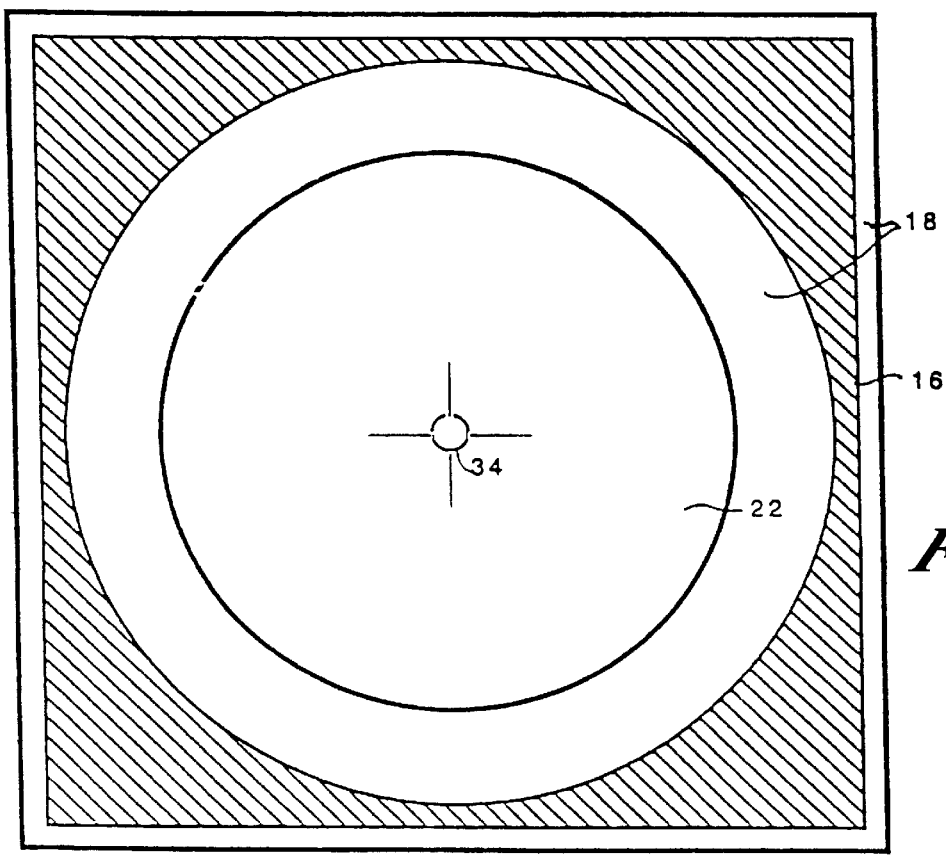
FIG. 4 is a plan view taken along the lines 4—4 of FIG. 1.

FIG. 4 is a plan view of the upper plate 22 and shows a single central opening 34 with four narrow radial slits for admitting cleaning fluids and for applying a vacuum to clamp the wafer to the plate. Several holes or narrow slits could be employed and the single hole 34 with radial slits is for illustrative purposes only.

The foregoing description is of the preferred embodiment. it is apparent that by changing the location of the drainage channel, the apparatus may be used in an inverted position or may be used vertically. It is intended, therefore, to be limited only by the scope of the appended claims.

Automated Wafer Processing Apparatus

FIGS. 7 to 11, shows an automated single-wafer processing system 100 which includes a framework 101 having a base portion 105 and upper chamber 110. In the base portion 105, there are chemical fluid delivery unit, effluent collector or recycling unit, on-line analyzer or sampling unit, vacuum unit and computer control unit.

Figure 7:
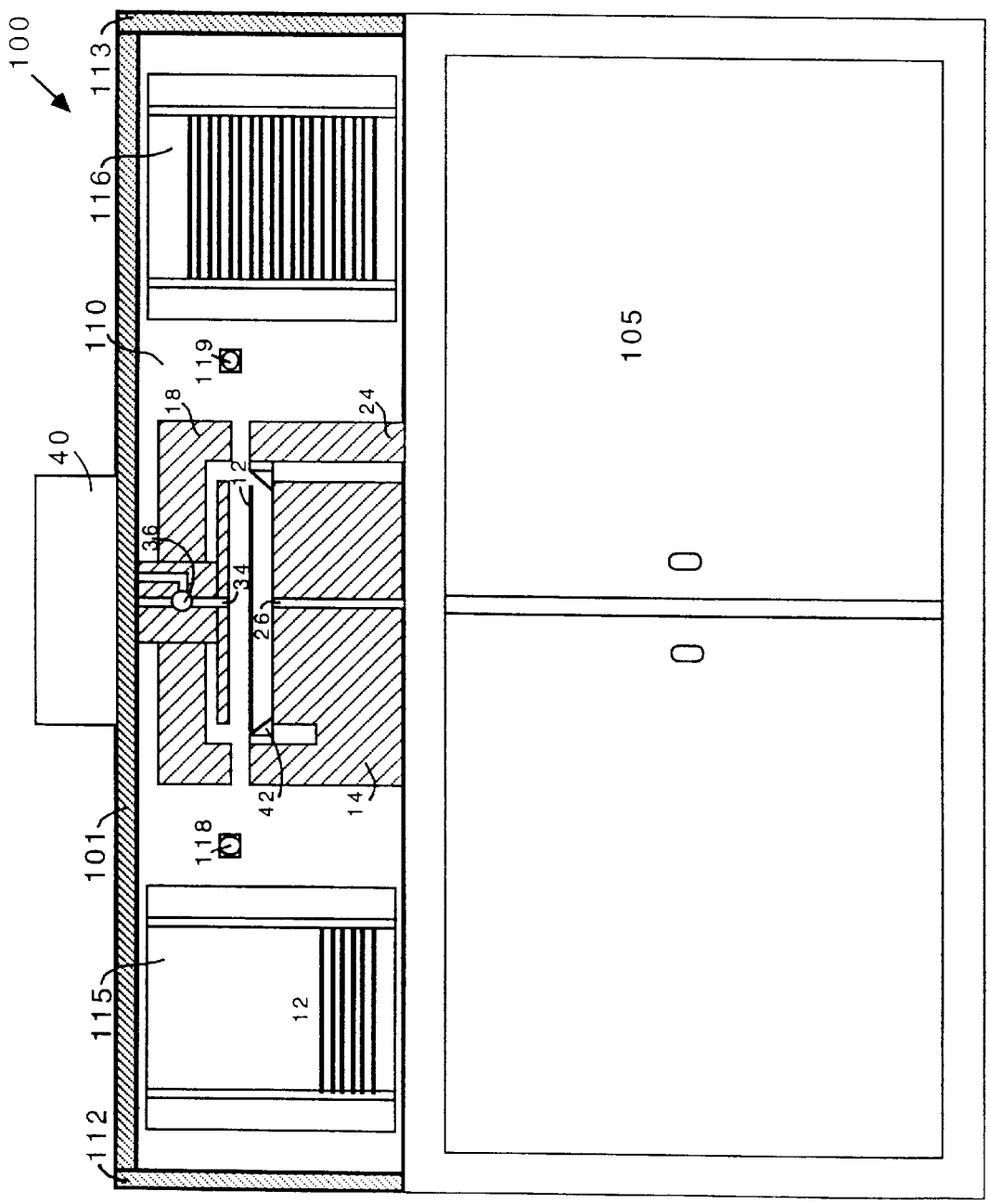
FIGS. 7–11 show preferred embodiment of a single wafer processing system according to the present invention.
Figure 8:
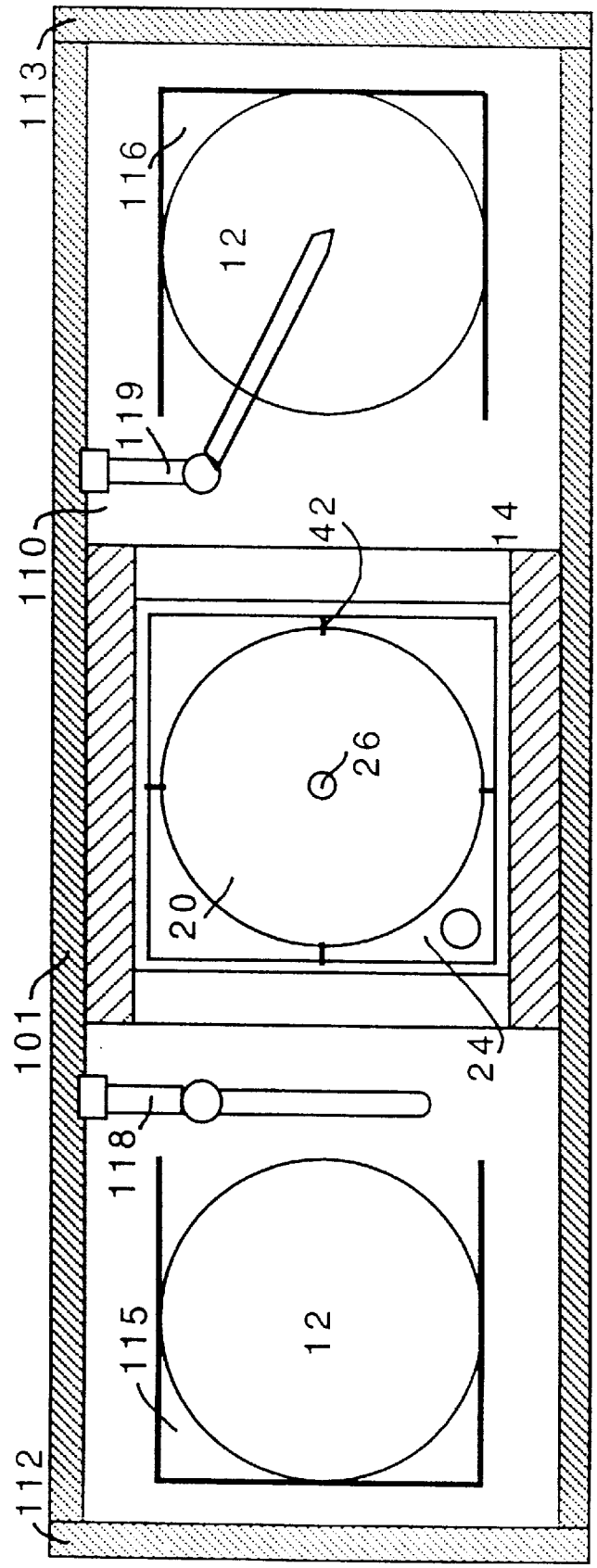

As shown in FIGS. 7 and 8, the wafer processor is contained in the upper chamber 110 which functions as a mini-environment with the capabilities of inner gas purge, gases elevating and flow balance according to the requirements of a particular process. Along with the wafer processor in the upper chamber, there are wafer containers 115 and 116 for wafers going to be processed and the wafers having been processed respectively. The wafer containers 115 and 116 are loaded into the chamber through the access door 112 and 113 respectively and are positioned as shown in FIGS. 7 to 11. The upper chamber further includes two robotic transfer units 118 and 119 for loading the wafer from wafer container 115 to the wafer processor and unloading the processed wafer from the processor to wafer container 116 as shown in FIGS. 7 to 8.

Figure 9:
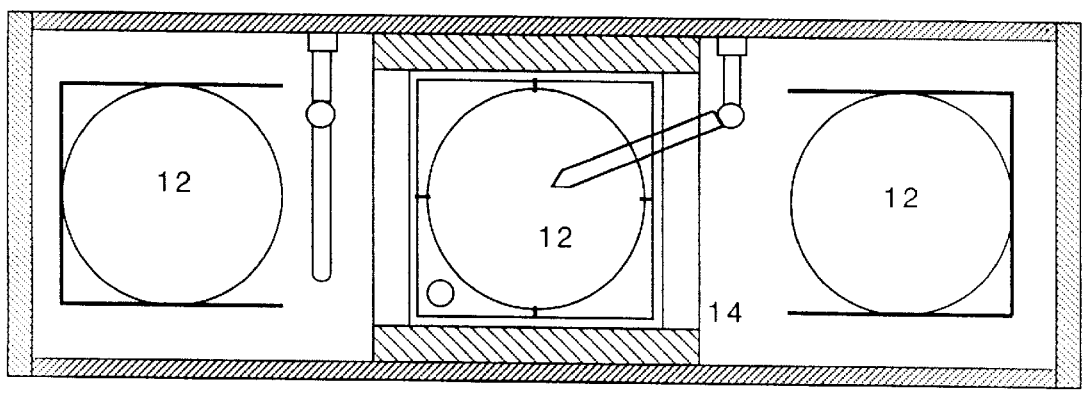
Figure 10:
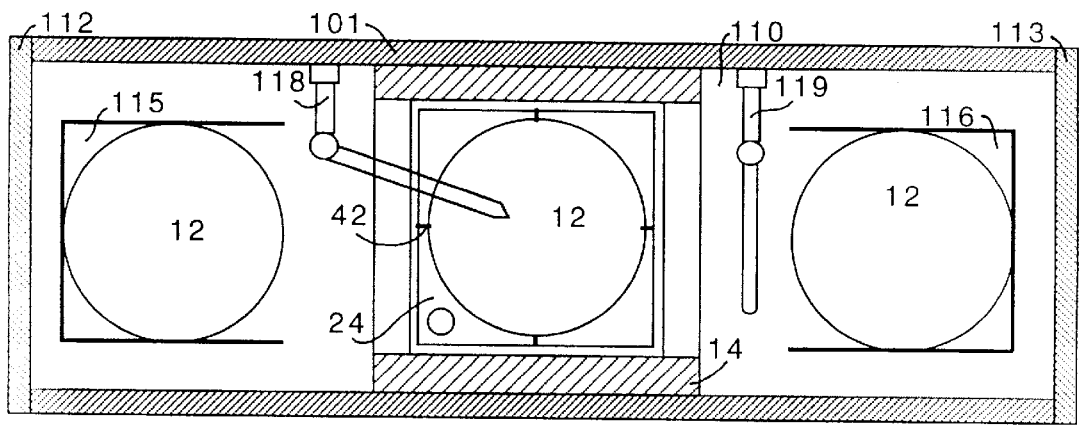
Figure 11:
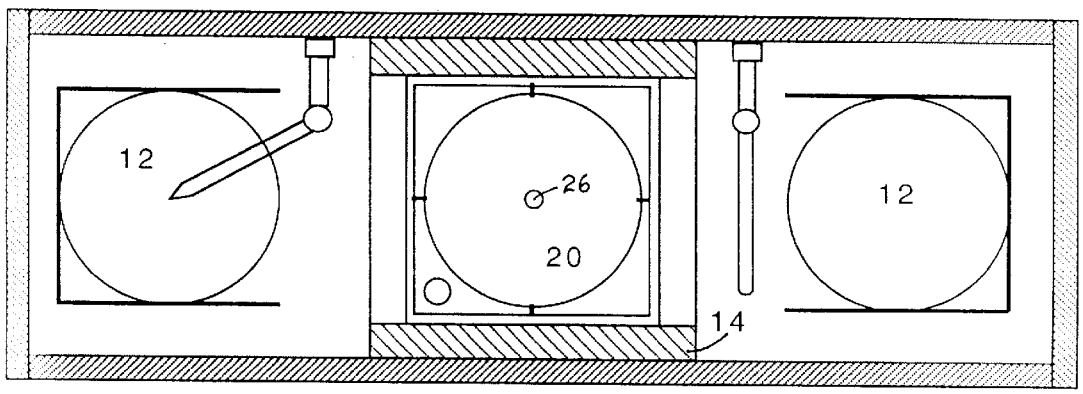

FIG. 8 shows transfer unit 118 at the first position for loading the wafer from wafer container 115 and shows transfer unit 119 at the initial position. FIG. 9 shows the transfer unit 118 at the last position for loading the wafer to wafer processor. FIG. 10 shows the transfer unit 119 at the first position for unloading the wafer from the processor. FIG. 11 shows the transfer unit 119 at the last position for unloading the wafer from the processing unit.

Figure 12:
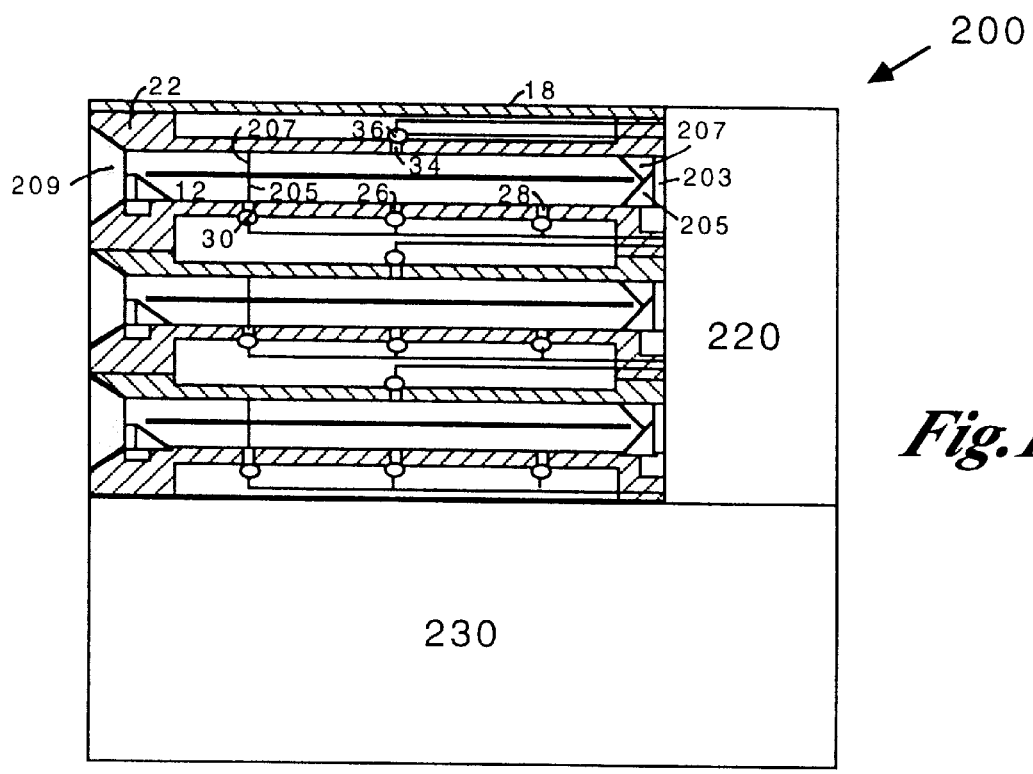
FIGS. 12–15 show a preferred embodiment of a multiple wafer semiconductor processing system according to the present invention.
Figure 13:
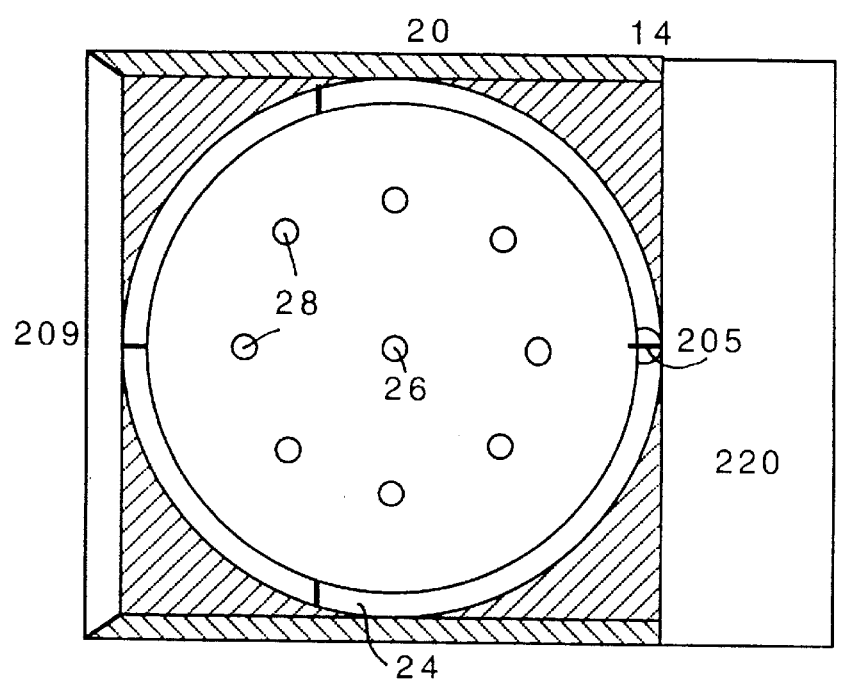
Figure 14:
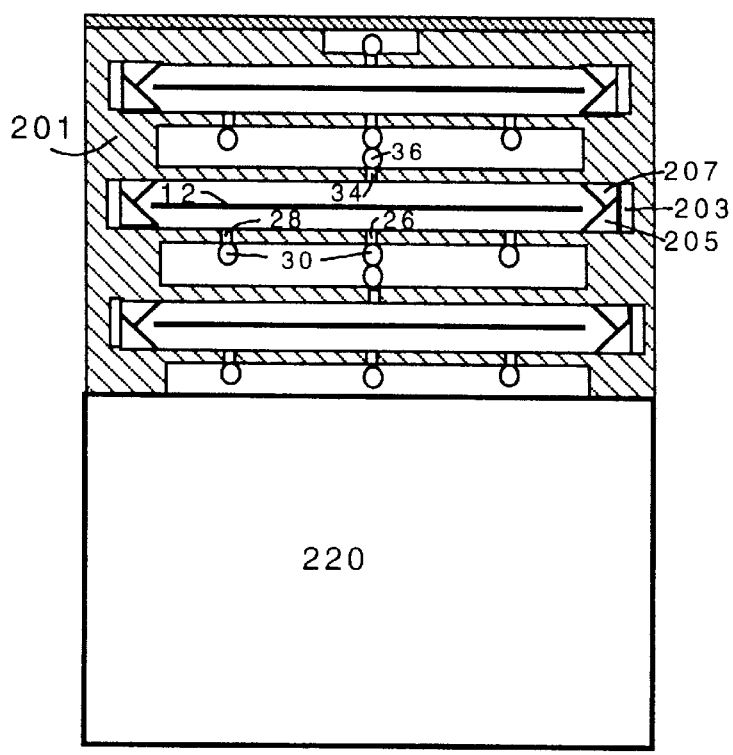
Figure 15:
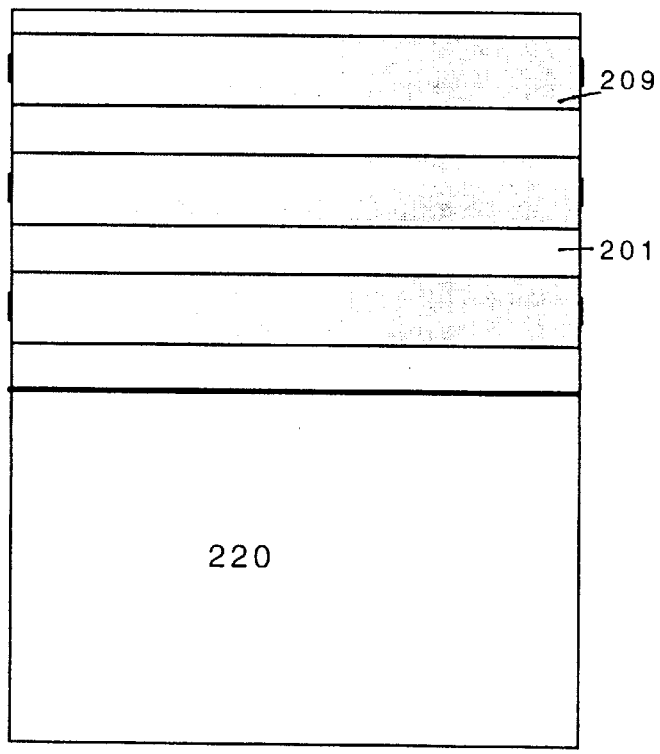

FIGS. 12 to 15 show a preferred automated multi-wafer semiconductor processing system 200 embodying the present invention. The automated multi-wafer processing system 200 includes a wafer processor unit 201, a back portion 220, a base portion 230 as shown in FIG. 12. In the base portion 230, there are effluent collector or recycling unit, on-line analyzer or sampling unit, vacuum unit and computer unit. In the back portion 220, there are chemical fluid delivery unit and computer interface.

The multi-wafer processor 201 is basically a set of single-wafer processors as shown in FIG. 1. A set of three is used as an example as shown in FIG. 12. Each single-wafer processor consists of a wafer holding frame 203 with four movable lower teeth 205 and three movable upper teeth 207. The frame 203 can be slid in and out from the working chamber for loading and unloading the wafer. The movable lower teeth 205 and upper teeth 207 are not only for securing the wafer, but also for defining the wafer position in the chamber. The front wall, or other appropriate side wall, can be adapted to function as an access door 209.

Wafers are loaded into the processing chamber by opening the door, sliding out the frame 203, inserting the wafer into the teeth 205–207, securing and positioning the wafer with the movable teeth 205–207, sliding frame with the wafer back into the processing chamber and closing the door 209. The operation procedure is automated and programmed controlled by the computer control unit. After the process is completed, open the accessing door 209, slide the wafer holding frame 203 out the working chamber, and unload the wafer 12.

The number of the single-wafer processors can be more than three. The working chamber of processor is simplified compared to the wafer processor shown in FIG. 1. The chemical fluid is injected and the vacuum is applied through the apertures on the top side of the processor chamber.

There are several advantages of this simplification: (1) less possibility of equipment contamination because of the simple structure and the less moving part in the working chamber; (2) smaller space of working chamber and lighter weight of the processor; and (3) easier in processors construction and simpler in operation.

The versatility in operation and simplicity in system construction are the very important characteristics of the automated multi-wafer processing system 200. The system can be compacted into a structure fairly small in size and light in weight. Therefore the automated multi-wafer processing apparatus can not only be used as a processing system but also as a mini-environment storage for storing and transferring wafers. That will make the system very useful in the semiconductor processing.

Application in Etching and Cleaning Processes

It is now common to use a series of cleaning processes after etching of silicon wafers. For example, Blended Hydrogen Fluoride Acid (BHF) treatment for oxide etching followed by RCA—Hydrogen Fluoride Acid (RCA-HF) last cleaning.

The sequence of chemical solutions used to clean a wafer depends upon the contaminants presented and the requirement of the process. It is reasonable to take the well-known RCA clean as an example since the RCA wet clean method is still widely used in the wafer cleaning process. The RCA cleans are based on a two-step process, the Standard Clean-1, referred to as SC-1, followed by Standard Clean 2, SC-2. In the Standard Clean-1, the SC-1 solution is typically a 5:1:1 mixture of deionized water, "unstabilized" hydrogen peroxide (30%, "not stabilized") and ammonium hydroxide (27 w/w% as $NH_3$). The working conditions are generally at 70 C. for 5–10 minute. In the Standard Clean-2, the SC-2 solution typically consists of 6:1:1 deionized water, hydrogen peroxide (30%, "not stabilized"), hydrochloric acid (37 w/w%), and the working conditions are at 70 C. for 510 minute.

The apparatus of FIG. 2 can be used to sequentially perform the steps of the BFH etching and RCA clean. In the process, the lower teeth 42 and the upper plate 22 are set at positions to define proper processing space heights. A processing protocol is generated in the computer unit 60. For example, At time-1, connect valves 30 and 36 to the chemical fluid line for double-side clean, start to inject deionized water to clean the working chamber.

At time-2, load the wafer on the lower teeth 1 mm above the lower plate 20 and position the upper plate 22 at 1 mm above the wafer 12.

At time-3, start to inject deionized water from valves 30 and 36 to clean both side of the wafer.

At time-4, purge nitrogen into the upper narrow space to dry the back surface of the wafer.

At time-5, switch valve 36 to the vacuum line and chuck the wafer by applying vacuum.

At time-6, wet the surface with deionized water containing surfactant reagent if it is needed.

At time-7, introduce the BHF mixture which is pre-mixed right before being pumped out the chemical fluid delivery unit and pushed into the lower narrow space for etching the wafer.

At time-8, inject deionized water to rinse out BHF.

At time-9, inject SC-1 solution at 70 degrees C. to clean the wafer.

At time-10, inject deionized water to rinse out SC-1 solution.

At time-11, inject SC-2 solution at 70 degrees C. to further clean the wafer.

At time-12, inject deionized water for rinsing.

At time-13, inject dilute hydrofluoric acid for positive -surface preparation.

At time-14, inject ultrapure nitrogen gas to push the water out the wafer surface.

At time-12, spin the wafer while the a hot nitrogen gas is injected to further dry the wafer.

At time-13, initial the position of the holding teeth 42 and the upper plate 22 and unload the wafer.

After the processing parameters have been carefully set up, the chemicals needed in the process are loaded in the proper containers, and then the processing program is started.

The optimum parameters for the best processing result according to specification of product and cost of the process can be obtained by adjusting the processing program. For example, to avoid micro-roughening of the silicon surface, it may be achieved by reducing the ammonia and hydrogen peroxide concentration in SC-1 to a minimum level without losing the effectiveness of cleaning.

Many advantages of the invention can be easily seen and understood through the example given above. The entire processing steps are conducted in one working chamber and carried out by a programmable sequence. This eliminates the transfer of wafers between baths, therefore prevent the re-contamination commonly occurred during the transfer. It substantially reduce the processing time and consumption of chemicals which includes the deionized water. It also reduces the cost for the equipment footprint and utilities' maintenance. The operation is very simple and much safer.

The processing quality can be well controlled because of the fully automated programming procedure and the ability of real-time process monitoring or on-line analyzing. The reproducibility is also expected to be improved.

Most existing techniques, for instance, megasonic treatment, brush scrubbing and photochemical techniques can be adopted into the system. The system can be easily implemented in the production environment and adapted into those well-established fabrication processes.

The system's capability of combining dry and wet processes permits the creation and development of new methods and techniques, and will aid the improvement of existing methodologies, such as HF-based cleaning, sulfuric-based cleaning, ozone treatment and chelating agents cleaning.

Application in Photolithography

In general, the photolithography process consists the following steps:

Step 1, cleaning, rinsing and drying the wafer to assure a utraclean surface.

Step 2, baking the wafer to remove both molecular water and silanol group (Si—OH) for good adhesion between the substrate and resist film by heating the wafer at 200–250 degrees C. for 30 minutes.

Step 3, priming the wafer to promote adhesion with an adhesion promoter such as hexamethyl disilazane (HMDS) for silicon dioxide.

Step 4, coating the wafer by dynamic dispense, for example, in which the resist is dispensed on rotating wafer.

Step 5, soft baking or postbaking to remove remaining solvents by heating the wafer at 90–100 degrees C.

Step 6, exposing the resist.

Step 7, developing the film by washing, or immersing, or spraying method.

Step 8, etching the film by wet or dry processes.

Step 9, removing the resist and cleaning the surface for a next process such as ion implantation and or dopant diffusion.

Figure 16:
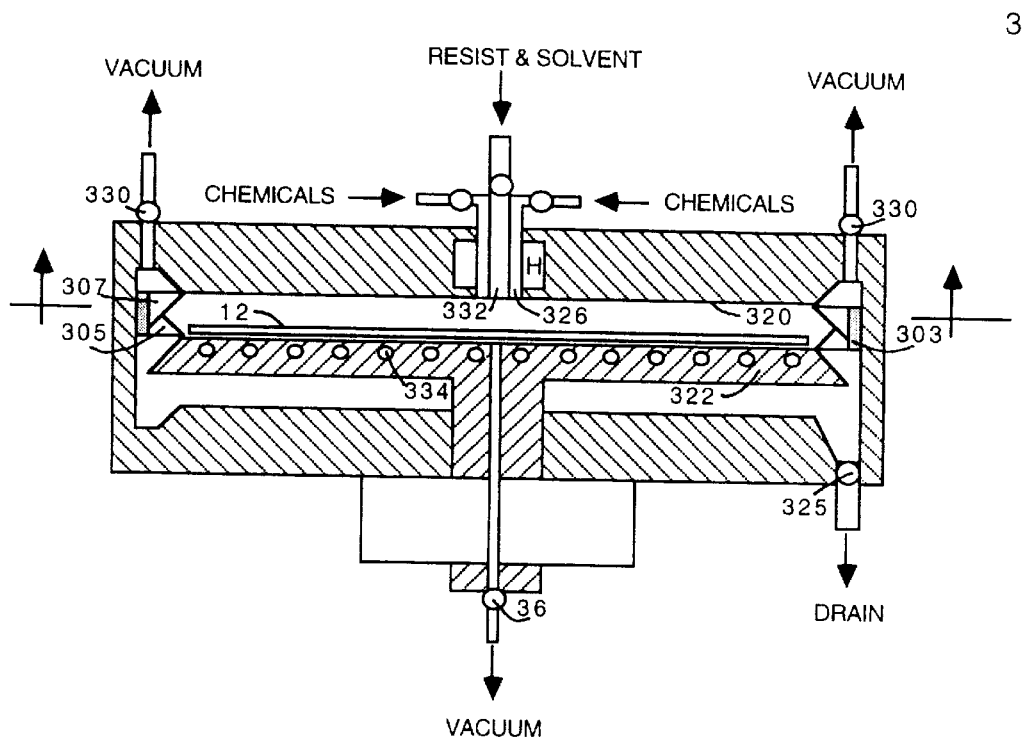
FIGS. 16–19 show an apparatus embodying the present invention used in photolithography.
Figure 17:
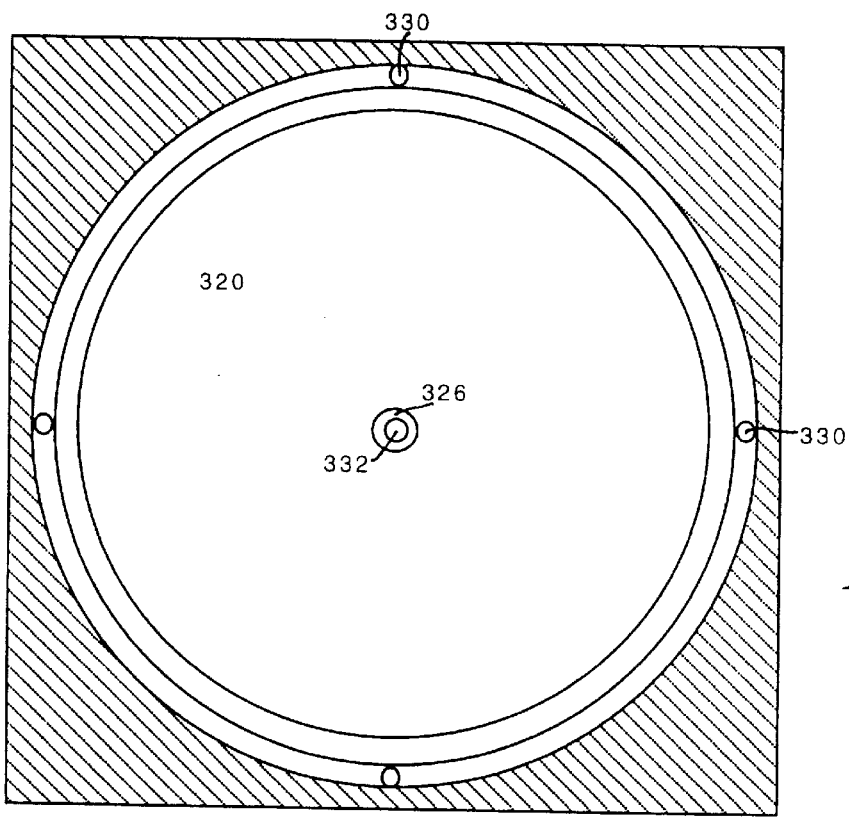

FIG. 16 and FIG. 17 show an apparatus 300 based upon the present invention which can be used to sequentially perform the step 1 to step 5 listed.

The wafer is loaded into the processing chamber by sliding out the holding frame 303, inserting and securing the wafer between the movable teeth 305–307, and sliding the frame with the secured wafer back into the processing chamber, where the wafer is positioned on the lower plate 322 which is rotatable and vertically movable, and secured by a vacuum chuck.

The wafer surface is cleaned and dried with fluid introduced from the aperture 326 on the upper plate 320 while the wafer is heated using the heating elements 334 in the lower plate 322. Drying the surface with hot nitrogen gas while heating up the wafer from the bottom may help the removal of molecular water and the silanol group. After cleaning and drying, the surface is primed by flowing the adhesion promoter over the surface if it is required. Resist is dispensed from the resist & solvent inlet 332 in the center of the upper plate on to the surface of the wafer while the wafer is spinning. Purging the chamber using an inert gas from the fluid opening 326 through the space between the surface of the wafer and the upper plate may help the remove of the volatile solvent and improve the adhesion of the resist. After the wafer is soft baked or postbaked by heating the wafer using heating elements 334 in the lower plate 322 while keeping the inert gas flow over the film, the wafer is ready for exposure.

Figure 18:
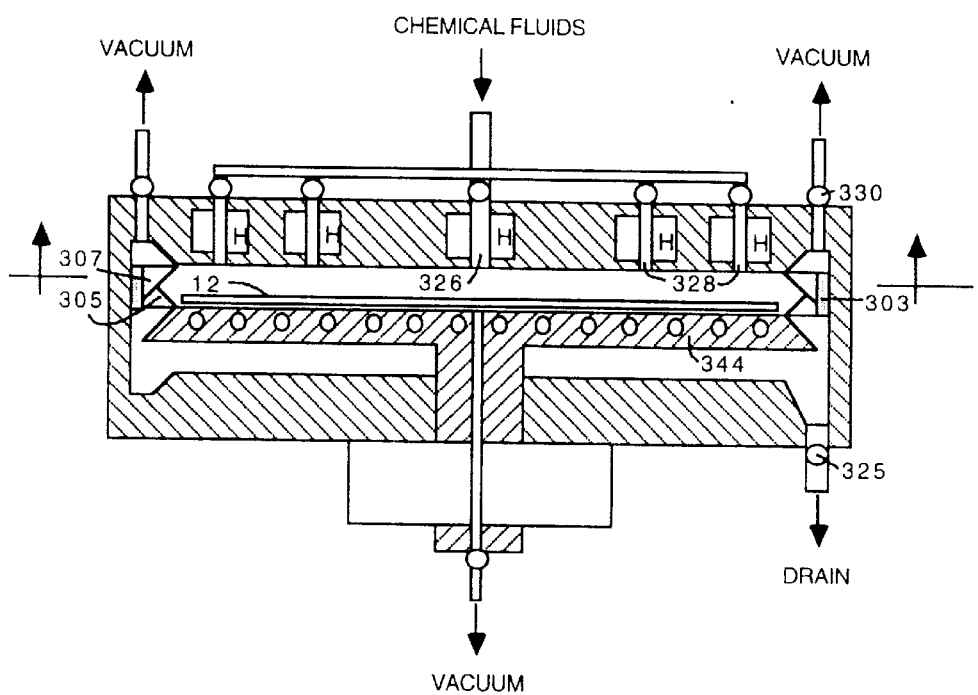
Figure 19:
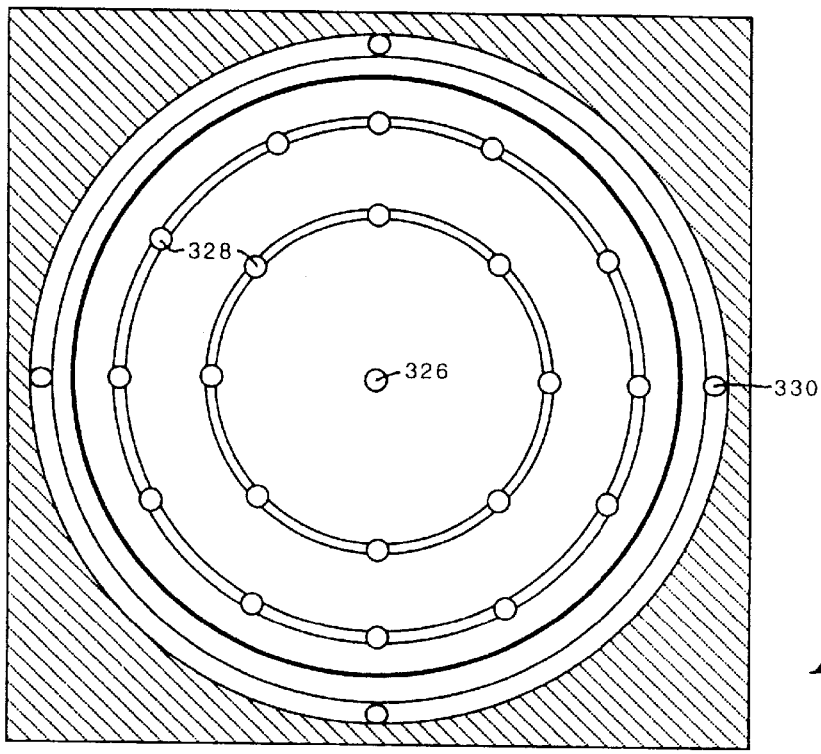

FIG. 18 and FIG. 19 show an apparatus based upon the present invention which can be used to sequentially perform the step 7 to step 9 listed above.

After the resist exposure, the wafer is loaded into the chamber on the lower plate 344 which is rotatable and vertically movable as shown in FIG. 18. The wafer is secured by the vacuum chuck, and the wafer surface is sequentially developed, rinsed, etched, stripped of resist, cleaned and dried by the programmed introduction of various chemical fluids into the narrow space between the wafer and the upper plate from the apertures 326 and 328 on the upper plate. The quality of processing may be improved by rotating, oscillating, or vertically moving the wafer during processing.

Figure 20:
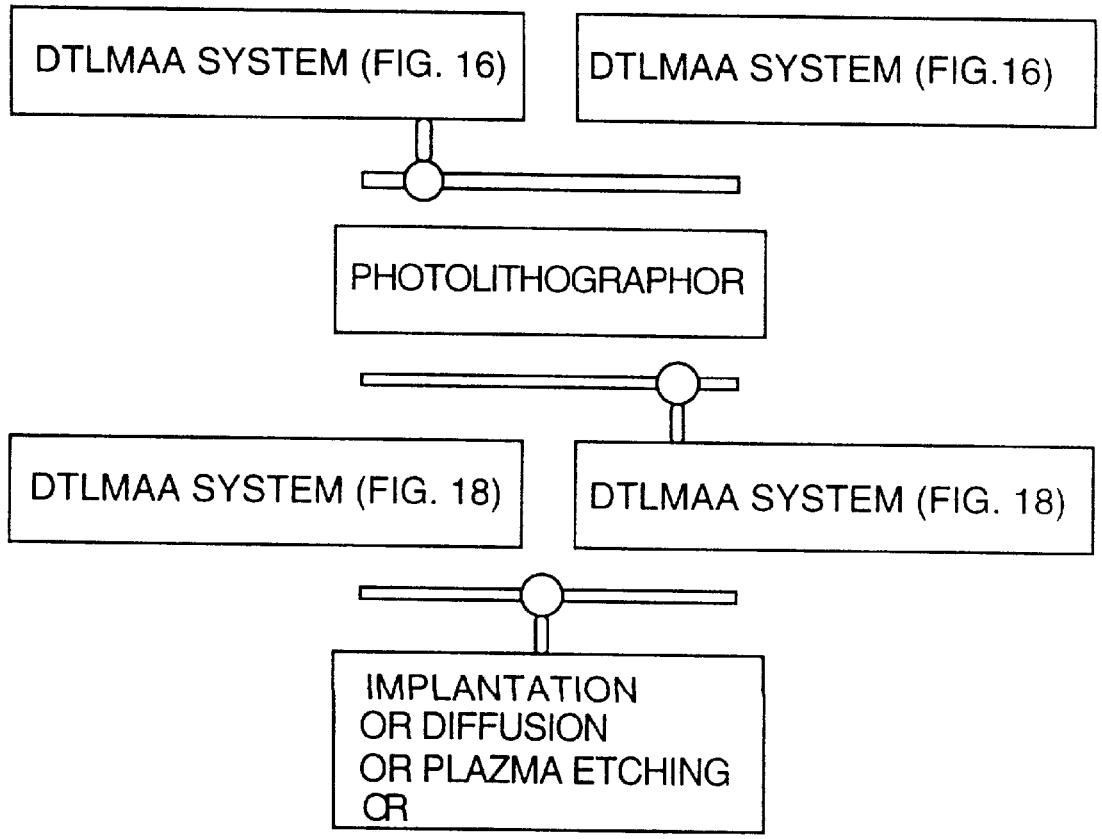

FIG. 20 illustrates a diagram of cluster-tools for photolithography and etching.

Application in Chemical Vapor Deposition (CVD)

A CVD process is designed to supply reactive gasses to the surface under conditions that encourage surface reaction and discourage reaction elsewhere. In CVD, one or more gasses react on a surface to form a film. The main requirements in CVD are to provide a uniform supply of gaseous reactant to the substrate surface and energy to activate the reactant and promote the reaction.

Figure 21:
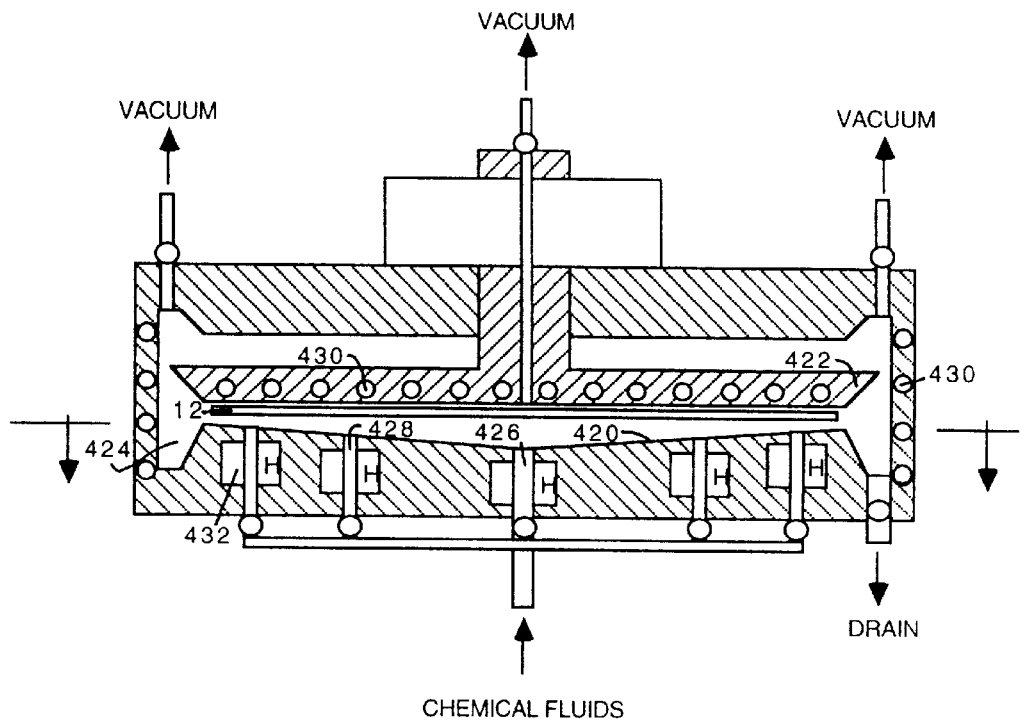
FIGS. 21 and 22 depict an apparatus embodying the present invention which can be used in chemical vapor deposition (CVD).
Figure 22:
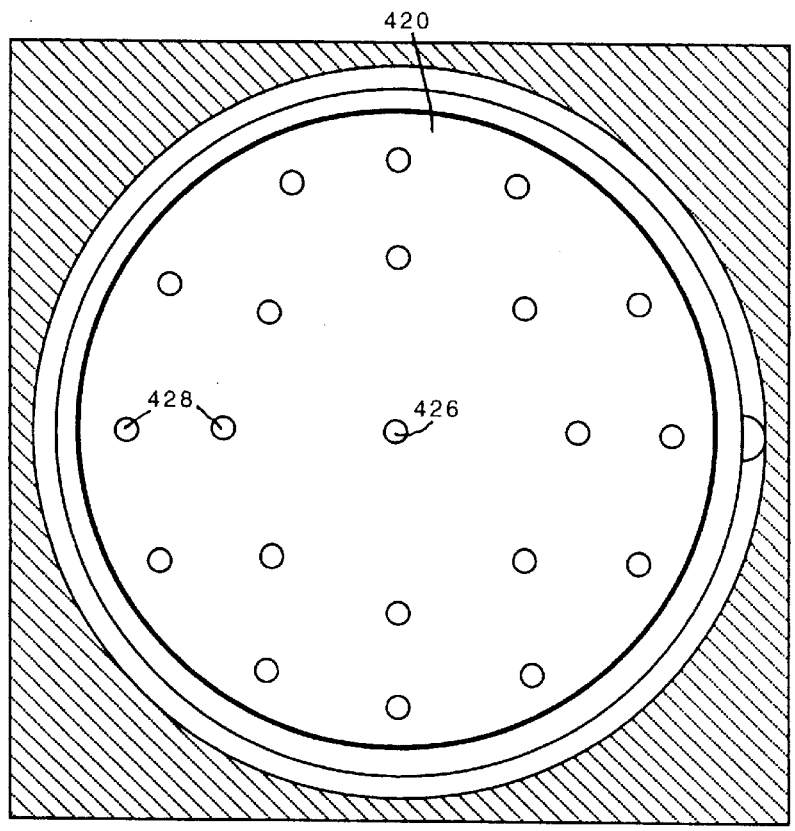

FIG. 21 and FIG. 22 shown an apparatus 400 based upon the present invention which can be used in the CVD process.

The wafer is loaded into the working chamber and secured on the upper plate 422 with vacuum chuck. The distance of the wafer to the surface of the lower plate 420 is adjusted by moving the upper plate 422 which is rotatable and vertically movable. The wafer is cleaned and dried if needed using a chemical fluid admitted from the openings 426 and 428 on the lower plate. The wafer and the working chamber are then heated with the heating elements 430, and the desired fluid is introduced into the chamber from the openings on the lower plate into the narrow space between the wafer and the surface of the lower plate. The temperature of the fluid can be controlled by the heating units 432. The "V" shape of the lower plate surface is designed for better uniformity of the process. Spinning or oscillating the wafer during processing results in a better quality film.

Application in Thin-film Deposition of Metals

The vacuum deposition method works best for elements or highly stable compounds of moderate melting points, especially when high purity is required; it is most useful with metallic conductors. In the process, the film material is transferred from a solid source, through a vacuum, to the substrate forming a metallic thin film on the surface. Vacuum deposition of a film requires two things: a vacuum and a source of film material.

Figure 23:
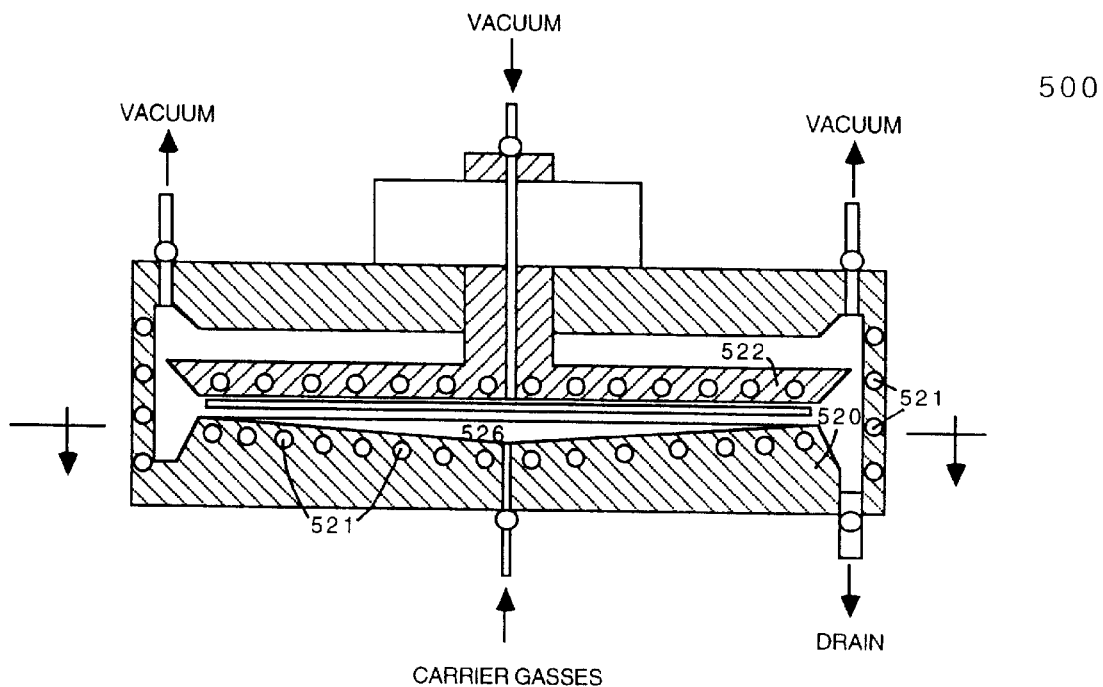
FIGS. 23 and 24 depict an apparatus embodying the present invention which can be used in the metallization process.
Figure 24:
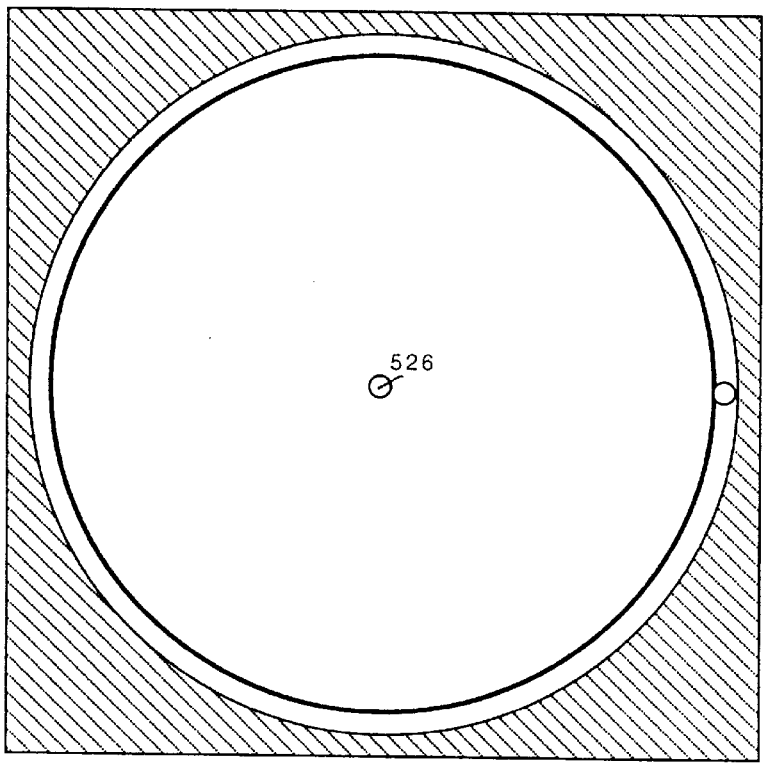

FIG. 23 and FIG. 24 show an apparatus 500 based upon the present invention which can be used in the metallization process. The wafer is loaded into the working chamber and secured on the upper plate 522 with a vacuum chuck. The distance of the wafer to the surface of the lower plate 520 is then adjusted by moving the upper plate which is rotatable and vertically movable. The working chamber is heated using heating elements 521, then the lower plate, which has a thin layer of the film material on the surface, is heated using heating elements 521. A steam of inert gas is introduced into the working chamber from the openings 526 on the lower plate into the narrow space between the wafer and the lower plate to enhance the step side coating and the uniformity of the overall coating of the film material onto the wafer. Step side coating refers to the coating of the sides of depressions etched into the wafer. A better quality film may be obtained by spinning or oscillating the wafer during processing.

Application in Surface Chemical Analysis

The ever-decreasing dimensions of microelectronics devices demands the refinement of traditional surface and materials characterization techniques and the inception of novel methodologies.

Direct surface analyses techniques such as Total Reflection X-Ray Fluorescence (TXRF), and Secondary Ion Mass Spectrometry (SIMS) have been the common methods for the determination of trace metal ions on a silica surface. The detection limits for these methods are ranged from $10^{10}$ to $10^{15}$ atoms/cm$^2$.

In the past few years, vapor phase decomposition (VPD) method, an indirect surface analysis method, have been extensively studied and applied to the analysis of metal ion contamination on a silicon surface in combination with Graphite Furnace Atomic Absorption Spectroscopy (GFAAS), Inductively Coupled Plasma-Mass Spectrometry (ICP-MS), TXRF or SIMS to achieve lower detection limit.

Vapor Phase Decomposition (VPD) involves wet-HF vapor preconcentration of contaminant of metals in the oxide layer on the very surface of wafer into a very small volume of solution. The measurement of the metals in the pre-concentrated liquid residue is accomplished by sensitive analytical instruments such as GFAA, TXRF, ICP-MS and SIMS.

The VPD method permits better detection limit which is very demanded in the semiconductor industry. But there are several disadvantages with the VPD extraction method. The method is limited to extraction of metal elements on silicon oxide layer only. The pre-concentration procedure is very time consuming. The performance is very labor intensive and is difficult to automate and standardize. The extraction efficiency is chemistry dependent and can vary dramatically for different metallic elements and substrates. The operator is constantly exposed to the HF vapor which is known harmful to human health.

Figure 25:
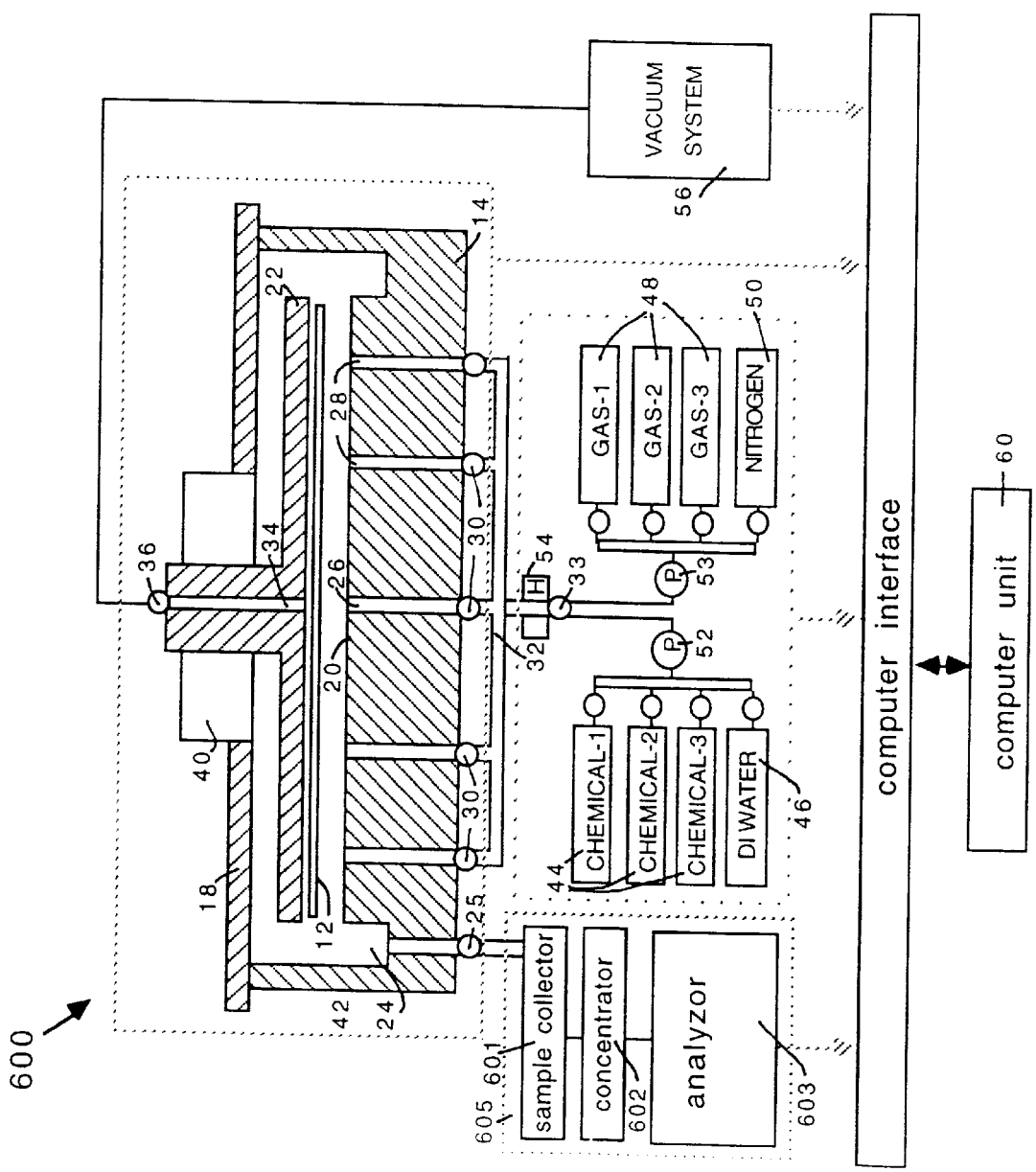
FIG. 25 depicts a surface chemical analysis system embodying the present invention.

FIG. 25 shows a surface chemical analysis system 600 for surface chemical analysis designed based on the present invention.

The component of the surface chemical extraction system 600 is almost the same as the surface chemical processing system FIG. 2. Except the monitoring unit and effluent collection unit or the chemical recycle unit in FIG. 2 is replaced by an analyzing unit 605 in FIG. 33.

The analyzing unit 605 in FIG. 25 consists of a sampler 601 for extract collection, a concentrator 602 for sample concentration and analyzers 603 for sample analyses such as ion chromatography and ICP-MS.

The wafer is chucked by applying the vacuum to the upper plate 22 and placed 0.005 mm–0.500 mm above the lower plate by the removable head 18 and vertically movable upper plate 22. Desired chemical fluids are introduced into the narrow space between the wafer surface and the lower plate surface, the extraction solution is collected by the sample collector, and the solution is concentrated by the concentrator. Then the concentrated residue is analyzed by an appropriate instrument, for example, by ICP-MS for metal contaminants and by High Performance Liquid Chromatography (HPLC) for organic contaminants.

The surface analysis system 600 shown in FIG. 25 can be used not only for extraction of metal impurities in the oxide layer of the wafer surface, but also for other inorganic and organic impurity species on the wafer surface and in the substrate, because of the wide choices of the chemistry of chemical fluids. The performance is simple, fast and easily automated. It also provides better extraction selectivity and efficiency.

While a number of preferred embodiments of the invention have been illustrated and described, it will be appreciated that various changes can be made therein without departing from the spirit and scope of the invention.

I claim:

1. A method for chemically processing a semiconductor wafer comprising the steps of:
   (a) inserting the wafer between an upper working surface and a lower working surface of an enclosed chamber;
   (b) supporting the wafer substantially parallel to the upper and lower working surfaces such that a narrow gap having a substantially uniform depth is created between substantially the entire area of at least one surface of the wafer and the corresponding area of the corresponding working surface; and
   (c) processing at least one surface of the wafer by
      (c1) injecting selected processing fluids into the enclosed chamber through at least one entry opening in either the upper working surface the lower working surface or both the upper and the lower working surfaces;
      (c2) forcing the selected processing fluids through the narrow gap and over the corresponding working surface of the wafer, and
      (c3) draining the selected processing fluids from the enclosed chamber through at least one drain in the chamber.

2. The method of claim 1, wherein the selected processing fluids are injected into the enclosed chamber through at least one entry opening below the wafer.

3. The method of claim 2, wherein the step of supporting the wafer comprises supporting the wafer at a selected height above the lower working surface by adjusting the volume flow rate of the selected processing fluids to be injected into the enclosed chamber through the at least one entry opening below the wafer in the step (c1) to thereby float the wafer to the selected height above the lower working surface.

4. The method of claim 1, wherein the selected processing fluids are injected into the enclosed chamber through at least one entry opening above the wafer, and at least one entry opening below the wafer.

5. The method of claim 4, wherein the step of supporting the wafer comprises supporting the wafer at a selected height above the lower working surface by adjusting a volume flow rate of the selected processing fluids to be injected into the enclosed chamber through the at least one entry opening below the wafer in the step (c1) to thereby float the wafer to the selected height above the lower working surface.

6. The method of claim 1, wherein the step of supporting the wafer comprises supporting the wafer at a selected height above the lower working surface by adjusting the positions of a plurality of beveled fingers spaced around the lower working surface to a selected height, relative to the lower working surface, prior to insertion of the wafer into the enclosed chamber; and wherein the step of inserting the wafer into the enclosed chamber comprises the step of inserting the wafer into the enclosed chamber such that the beveled fingers contact and support the edge portion of the wafer.

7. The method of claim 1, wherein step (c1) of injecting selected processing fluids into the enclosed chamber comprises the step of injecting the selected processing fluids into the enclosed chamber through at least one entry opening above the wafer.

8. The method of claim 1, wherein the step (c2) of forcing the selected processing fluids through the at least one narrow gap comprises the step of forcing the selected processing fluids through a gap of 0.01 to 10.0 mm, inclusive.

9. The method of claim 1, where the chemical processing comprises a process of etching the semiconductor wafer, wherein the step (c) is performed wherein the selected processing fluids are for cleaning both sides of-the wafer, the method further comprising the steps of:
   (d) preparing the semiconductor wafer for etching;
   (e) attaching the semiconductor wafer to the upper working surface; and
   (f) etching the semiconductor wafer by repeating step (c) using etching chemicals as the selected processing fluids.

10. The method of claim 9, wherein the preparing step (d) comprises the step of injecting nitrogen into the chamber to displace the selected processing fluids used for cleaning the wafer.

11. The method of claim 9, wherein the attaching step comprises the step of applying a vacuum through at least one entry opening located in the upper working surface.

12. The method of claim 9, further comprising the step of rinsing out the etching chemicals.

13. The method of claim 1 where the chemical processing of the semiconductor wafer comprises a photolithography process, wherein the step (b) of supporting the wafer comprises the step of attaching the wafer to the lower working surface, the lower working surface being rotatable and movable toward and away from the upper working surface; wherein step (c) is performed using a cleaning solution as the selected processing fluids to clean the top surface of the wafer while baking the wafer using heating elements located in the lower working surface, the method further comprising the steps of:

(d) priming the surface of the wafer;

(e) applying resist to the surface of the wafer;

(f) exposing the wafer; and (g) preparing the wafer.

14. The method of claim 1, wherein the chemical processing of the semiconductor wafer comprises a chemical vapor deposition process, wherein the step (b) of supporting the wafer comprises the step of attaching the wafer to the upper working surface, the upper working surface being rotatable and movable toward and away from the lower working surface; further comprising the step of forming a film on the surface of the wafer by heating the wafer using heating elements located in the upper working surface is performed prior to performing step (c) using one or more gasses chosen to react with the surface as the selected processing fluids.

15. The method of claim 14, wherein the attaching step comprises the step of applying a vacuum through the at least one entry opening located in the upper working surface.

16. The method of claim 1, wherein the chemical processing of the semiconductor wafer comprises a thin-film deposition of metals process, wherein the step b) of supporting the wafer comprises the step of attaching the wafer to the upper working surface, the upper working surface being rotatable and movable toward and away from the lower working surface; wherein step (c) is performed using a steam of gas as the selected processing fluids to form a metallic thin film on the surface of the wafer, the method further comprising the steps of:

prior to performing step (c), heating the wafer using heating elements located in the upper working surface; and prior to performing step (c), evacuating the chamber;

Wherein the steam of gas is introduced into the chamber through the entry openings on the lower working surface.

17. The method of claim 1, where the chemical processing of the semiconductor wafer comprises a surface chemical analysis process, wherein the step (b) of supporting the wafer comprises the step of attaching the wafer to the upper working surface, the upper working surface being rotatable and movable toward and away from the lower working surface, the method further comprising the steps of:

(d) collecting and sampling the selected processing fluids from the at least one drain; and (e) analyzing the concentrated residue for contaminants.

18. The method of claim 1, wherein the lower working surface of the enclosed chamber has a plurality of concentric groves and openings within the concentric groves to allow the selected processing fluids to enter the enclosed chamber and distribute substantially evenly on the working surface of the wafer.

19. The method of claim 18, further comprising the steps of:

(d) attaching the wafer to the upper working surface of the enclosed chamber; and (e) positioning the upper working surface so that the lower surface of the wafer is disposed substantially less than 1 mm from the lower working surface of the enclosed chamber, thereby conserving the selected processing fluids during processing of the wafer.

20. The method of claim 1, wherein either the upper working surface or the lower working surface of the enclosed chamber has a plurality of radially oriented groves and openings within the radially oriented groves to allow the selected processing fluids to enter the enclosed chamber and distribute evenly on the working surface of the wafer.

* * * * *

UNITED STATES PATENT AND TRADEMARK OFFICE
CERTIFICATE OF CORRECTION

PATENT NO. : 6,239,038 B1
DATED : May 29, 2001
INVENTOR(S) : Z. Wen

It is certified that error appears in the above-identified patent and that said Letters Patent is hereby corrected as shown below:

<u>Title page,</u>
Item [63], Related U.S. Application Data, "08/543,071," should read -- 07/543,071, --
*Assistant Examiner*, "Duy-Vu" should read -- DuyVu --
Item [57], ABSTRACT,
Line 1, "method and apparatus for" should read -- method for --

<u>Column 12,</u>
Line 47, "of-the" should read -- of the --

<u>Column 13,</u>
Line 30, "b)" should read -- (b) --

<u>Column 14,</u>
Line 2, "Wherein" should read -- wherein --

Signed and Sealed this

Thirteenth Day of August, 2002

*Attest:*

JAMES E. ROGAN
*Attesting Officer*  *Director of the United States Patent and Trademark Office*